(12) United States Patent
Yu

(10) Patent No.: US 11,081,557 B2
(45) Date of Patent: Aug. 3, 2021

(54) MEMORY AND METHOD FOR FORMING THE SAME

(71) Applicant: Shanghai Huahong Grace Semiconductor Manufacturing Corporation, Shanghai (CN)

(72) Inventor: Tao Yu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/788,943

(22) Filed: Feb. 12, 2020

(65) Prior Publication Data
US 2021/0036117 A1    Feb. 4, 2021

(30) Foreign Application Priority Data

Jul. 29, 2019 (CN) .......................... 201910686955.X

(51) Int. Cl.
*H01L 29/423* (2006.01)
*H01L 21/28* (2006.01)
(Continued)

(52) U.S. Cl.
CPC .. *H01L 29/42328* (2013.01); *H01L 21/26513* (2013.01); *H01L 21/7684* (2013.01);
(Continued)

(58) Field of Classification Search
CPC ......... H01L 29/42328; H01L 29/66795; H01L 27/11517; H01L 21/7684; H01L 23/535
See application file for complete search history.

(56) References Cited

U.S. PATENT DOCUMENTS 9,406,689 B2 * 8/2016 Li ..................... H01L 29/66795
9,406,758 B2    8/2016 Rezanezhad Gatabi
(Continued)

FOREIGN PATENT DOCUMENTS

| CN | 103811498 A | 5/2014 |
| CN | 107230677 A | 10/2017 |
| CN | 109196649 A | 1/2019 |

OTHER PUBLICATIONS

First Chinese Office Action regarding Application No. 201910686955.X dated Feb. 23, 2021. English translation provided by Unitalen Attorneys at Law.

*Primary Examiner* — Changhyun Yi
(74) *Attorney, Agent, or Firm* — Harness, Dickey & Pierce, P.L.C.

(57) ABSTRACT

The present disclosure provides a memory and a method for forming the memory. The method includes: providing a base with a first fin and a second fin formed thereon, wherein the first fin comprises an erasing region and a floating gate region on both sides of the erasing region, and a sacrificial layer is disposed on a surface of the erasing region and a surface of the second fin; forming a floating gate structure across the floating gate region on the base; forming a first sidewall film on a top surface and sidewall surfaces of the floating gate structure on the base; removing the sacrificial layer, and forming an opening in the floating gate structure and the first sidewall film; and forming an erasing gate structure in the opening. The memory formed by the method has good performance.

17 Claims, 10 Drawing Sheets

(51) Int. Cl.
- *H01L 21/265* (2006.01)
- *H01L 21/768* (2006.01)
- *H01L 23/535* (2006.01)
- *H01L 29/66* (2006.01)
- *H01L 29/78* (2006.01)
- *H01L 29/788* (2006.01)

(52) U.S. Cl.
CPC .. *H01L 21/76805* (2013.01); *H01L 21/76895* (2013.01); *H01L 23/535* (2013.01); *H01L 29/40114* (2019.08); *H01L 29/66795* (2013.01); *H01L 29/66825* (2013.01); *H01L 29/7851* (2013.01); *H01L 29/7881* (2013.01)

(56) References Cited

U.S. PATENT DOCUMENTS

| | | |
|---|---|---|
| 9,640,403 B2 | 5/2017 | Fan et al. |
| 9,985,042 B2 | 5/2018 | Su et al. |
| 2005/0133851 A1 | 6/2005 | Forbes |
| 2015/0243795 A1 | 8/2015 | Fan et al. |
| 2016/0064398 A1 | 3/2016 | Toh et al. |
| 2017/0338237 A1* | 11/2017 | Colinge ............ H01L 29/40114 |
| 2017/0345840 A1 | 11/2017 | Su et al. |
| 2020/0027888 A1* | 1/2020 | Chern ................ H01L 27/11519 |
| 2020/0152649 A1* | 5/2020 | Chern ................ H01L 29/7883 |

* cited by examiner

MEMORY AND METHOD FOR FORMING THE SAME

CROSS-REFERENCE TO RELATED APPLICATIONS

This application claims the benefit of priority to Chinese patent application No. 201910686955.X, filed on Jul. 29, 2019. The entire contents of this application are hereby incorporated herein by reference.

TECHNICAL FIELD

The present disclosure relates to the field of semiconductor manufacturing, and more particularly to a memory and a method for forming the memory.

BACKGROUND

In the current semiconductor industry, integrated circuit product mainly includes three types: analog circuit, digital circuit and digital/analog hybrid circuit. In whatever types of circuits, memory is an important circuit of the digital circuit. In recent years, flash memory (referred to as flash) has developed rapidly. The main feature of the flash memory is that it can keep stored information for a long time without power on, and has the advantages of high integration, fast storage speed, and easy to erase and rewrite. Therefore, it has been widely applied in many fields such as microcomputer, automatic control, etc.

Flash memory mainly includes two types: stack gate flash memory and split gate flash memory. The stacked flash memory has a floating gate and a control gate above the floating gate, which may cause over erasure problem in the stacked flash memory. Different from the stacked flash memory, the split gate flash memory has a word line as an erasing gate disposed at one side of the floating gate which effectively avoids over erasure.

There is a need for improving performance of the split gate flash memory.

SUMMARY

The present disclosure provides a memory and a method for forming the memory to improve the performance of the memory.

An embodiment of the present disclosure provides a method for forming a memory. The method includes: providing a base with a first fin formed thereon, wherein the first fin includes an erasing region and a floating gate region, the floating gate region is adjacent to the erasing region and each side of the erasing region is disposed with the floating gate region, wherein the base is further disposed with a second fin on both sides of the first fin and the second fin elongates along a direction perpendicular to an elongation direction of the first fin, and a surface of the erasing region and a surface of the second fin are covered with a sacrificial layer; forming a floating gate structure across the floating gate region on the base, wherein a surface of the floating gate structure is lower than a top surface of the sacrificial layer; forming a first sidewall film on the base, wherein the first sidewall film covers a top surface and sidewall surfaces of the floating gate structure, and a top surface of the first sidewall film is flush with the top surface of the sacrificial layer; removing the sacrificial layer to form an opening in the floating gate structure and the first sidewall film so as to expose the surface of the erasing region and the surface of the second fin at a bottom of the opening; and forming an erasing gate structure in the opening, wherein a surface of the erasing gate structure is flush with the top surface of the first sidewall film.

In some embodiment, forming the floating gate structure includes: forming an initial floating gate film on the base covering a top surface and sidewall surfaces of the first fin, sidewall surfaces of the second fin and the top surface and sidewall surfaces of the sacrificial layer; planarizing the initial floating gate film to expose the top surface of the sacrificial layer to form a floating gate film on the base, wherein a surface of the floating gate film is flush with the top surface of the sacrificial layer; forming a first patterning layer on the surface of the floating gate film, wherein the first patterning layer covers the surface of the floating gate film on the floating gate region and covers a portion of the surface of the floating gate film at two sides of the floating gate region along the direction perpendicular to the elongation direction of the first fin; and etching the floating gate film with the first patterning layer as a mask to expose a surface of the base so as to form an initial floating gate structure across the floating gate region on the base; and etching back the initial floating gate structure to form the floating gate structure so that the top surface of the floating gate structure is lower than the top surface of the sacrificial layer.

In some embodiment, the initial floating gate film includes: an initial floating gate dielectric film disposed on the top surface and the sidewall surfaces of the first fin and on the sidewall surfaces of the second fin; and an initial floating gate electrode film disposed on a surface of the initial floating gate dielectric film and on the top surface and sidewall surfaces of the sacrificial layer; wherein the initial floating gate dielectric film is made of silicon oxide or a high-k dielectric material, and the initial floating gate electrode film is made of polysilicon or a metal.

In some embodiment, forming the first sidewall film includes: forming a first sidewall film on the base covering the first fin and the second fin, wherein the first sidewall film is disposed on the top surface and sidewall surfaces of the floating gate structure and a surface of the sacrificial layer; and planarizing the first sidewall film to expose the top surface of the sacrificial layer so to form the first sidewall film disposed on the top surface and the sidewall surfaces of the floating gate structure on the base.

In some embodiment, the sacrificial layer is made of a material different from the first sidewall film, the sacrificial layer is made of a material selected from a group consisting of silicon oxide, silicon nitride, silicon carbonitride, silicon boronnitride, silicon oxycarbonitride and silicon oxynitride, and the first sidewall film is made of a material selected from a group consisting of silicon oxide, silicon nitride, silicon carbonitride, silicon boronnitride, silicon oxycarbonitride and silicon oxynitride.

In some embodiment, the method further includes: forming a source in the erasing region of the first fin and in the second fin at the bottom of the opening after forming the opening and before forming the erasing region; wherein forming the source includes: performing an ion implantation process on the erasing region of the first fin and the second fin at the bottom of the opening with the floating gate structure and the first sidewall film as a mask to form the source.

In some embodiment, forming the erasing gate structure includes: forming an erasing gate film in the opening and on the top surface of the first sidewall film; and planarizing the erasing gate film to expose the top surface of the first sidewall film so as to form the erasing gate structure on the erasing region of the first fin and the second fin.

In some embodiment, the erasing gate film includes: an erasing dielectric film disposed on a sidewall surface and a bottom surface of the opening and the top surface of the first sidewall film; and an erasing electrode film disposed on a surface of the erasing dielectric film; wherein the erasing dielectric film is made of silicon oxide or a high-k dielectric material, and the erasing electrode film is made of polysilicon or a metal.

In some embodiment, after forming the erasing gate structure, the method further includes: etching a portion of the first sidewall film to expose a surface of the base so as to form a first sidewall, wherein the first sidewall is disposed on the top surface and sidewall surfaces of the floating gate structure; forming a word line structure on a sidewall surface of the first sidewall along the elongation direction of the first fin after forming the first sidewall, wherein the word line structure is disposed on sidewall surfaces and a top surface of the first fin; forming a second sidewall on a sidewall surface of the word line structure along the elongation direction of the first fin; and forming a bit line structure in the first fin on two sides of the first sidewall, the erasing gate structure, the second sidewall and the word line structure.

In some embodiment, forming the word line structure includes: forming an initial word line film on the base covering the top surface and sidewall surfaces of the first fin, the surface of the erasing gate structure and a top surface and the sidewall surface of the first sidewall; planarizing the initial word line film to expose the surface of the erasing gate structure so as to form a word line film on the base, wherein the word line film is disposed on the sidewall surface of the first sidewall along the elongation direction of the first fin; forming a third patterning layer on a surface of the word line film, wherein the third patterning layer is disposed on the surfaces of the erasing gate structure, the first sidewall and a portion of the word line film; and etching the word line film with the third patterning layer as a mask to expose the surface of the base so as to form the word line structure.

In some embodiment, the initial word line film includes: an initial word line dielectric film disposed on the top surface and sidewall surfaces of the first fin and on the surface of the erasing gate structure, and an initial word line electrode film disposed on a surface of the initial word line dielectric film and on the sidewall surface and the top surface of the first sidewall; wherein the initial word line dielectric film is made of silicon oxide or a high K dielectric material, and the initial word line electrode film is made of polysilicon or metal.

In some embodiment, etching a portion of the first sidewall film includes: forming a second patterning layer on the surface of the first sidewall film, wherein the second patterning layer is disposed on the surface of the first sidewall film on the floating gate region and on the surface of the first sidewall film on two sides of the floating gate region along the direction perpendicular to the elongation direction of the first fin; and etching the first sidewall film with the second patterning layer as a mask to expose the surface of the base so as to form the first sidewall.

In some embodiment, forming the bit line structure includes: performing an ion implantation process on the first fin to form the bit line structure in the first fin with the first sidewall, the erasing gate structure, the second sidewall and the word line structure as a mask.

In some embodiment, forming the bit line structure includes: etching the first fin to form a groove in the first fin with the first sidewall, the erasing gate structure, the second sidewall and the word line structure as a mask; and forming an epitaxy layer in the groove in an epitaxy process to form the bit line structure.

Another embodiment of the present disclosure provides a memory. The memory includes: a base with a first fin formed thereon, wherein the first fin includes an erasing region and a floating gate region, the floating gate region is adjacent to the erasing region and each side of the erasing region is disposed with the floating gate region, wherein the base is further disposed with a second fin on both sides of the first fin and the second fin elongates along a direction perpendicular to an elongation direction of the first fin; a floating gate structure across the floating gate region of the first fin on the base, wherein a surface of the floating gate structure is lower than a top surface of a sacrificial layer; a first sidewall disposed on a top surface and sidewall surfaces of the floating gate structure, wherein a top surface of the first sidewall is flush with the top surface of the sacrificial layer; and an erasing gate structure disposed on the erasing region of the first fin and the second fin, wherein a surface of the erasing gate structure is flush with the surface of the first sidewall.

In some embodiment, the memory further includes: a source disposed in the erasing region of the first fin and disposed in the second fin.

In some embodiment, the memory further includes: a word line structure disposed on a sidewall surface of the first sidewall along the elongation direction of the first fin, wherein the word line structure runs across the first fin; and a second sidewall disposed on a sidewall surface of the word line structure along the elongation direction of the first fin, wherein the second sidewall runs across the first fin; and a bit line structure disposed in the first fin on two sides of the first sidewall, the erasing gate structure, the second sidewall and the word line structure.

Compared with the conventional technology, embodiments of the present disclosure have the following beneficial effects.

In the method for forming a memory according to embodiments of the present disclosure, the floating gate structure film is formed in the floating gate region, and the floating gate structure film crosses the top surface and sidewall surfaces of the floating gate region of the first fin. Therefore, after subsequent etching of the floating gate structure film, the formed floating gate structure crosses the top surface and sidewall surfaces of the floating gate region of the first fin, that is, the floating gate structure surrounds the floating gate region of the first fin. Thus, a coupling area between the floating gate structure and the source subsequently formed in the second fin and the erasing region of the first fin is increased, which thereby increases a coupling rate between the source and the floating gate structure, so that a coupling voltage of the source on the floating gate structure increases during programming. Further, the subsequently formed erasing gate structure is disposed on the surfaces of the erasing region and the second fin, the erasing gate structure has a planar structure, and a coupling area between the erasing gate structure and the floating gate is relative small. By making the coupling area between the erasing gate structure and the floating gate structure smaller than the coupling area between the source and the floating gate structure, the coupling rate between the erasing gate structure and the floating gate structure is decreased, which facilitates improving erasing and writing efficiency, and thus improves the performance of the formed memory.

Further, the floating gate structure and the word line structure are used together to control a reading status of the memory. The floating gate structure crosses the top surface and sidewall surfaces of the floating gate region of the first fin, that is, the floating gate structure surrounds the floating gate region of the first fin, which facilitates increasing an effective width of a channel below the bottom of the floating gate structure. Therefore, a channel resistance between the source and the bit line structure is reduced, which facilitates improving a reading current, and thus improves the performance of the formed memory.

DETAILED DESCRIPTION

Figure 1:
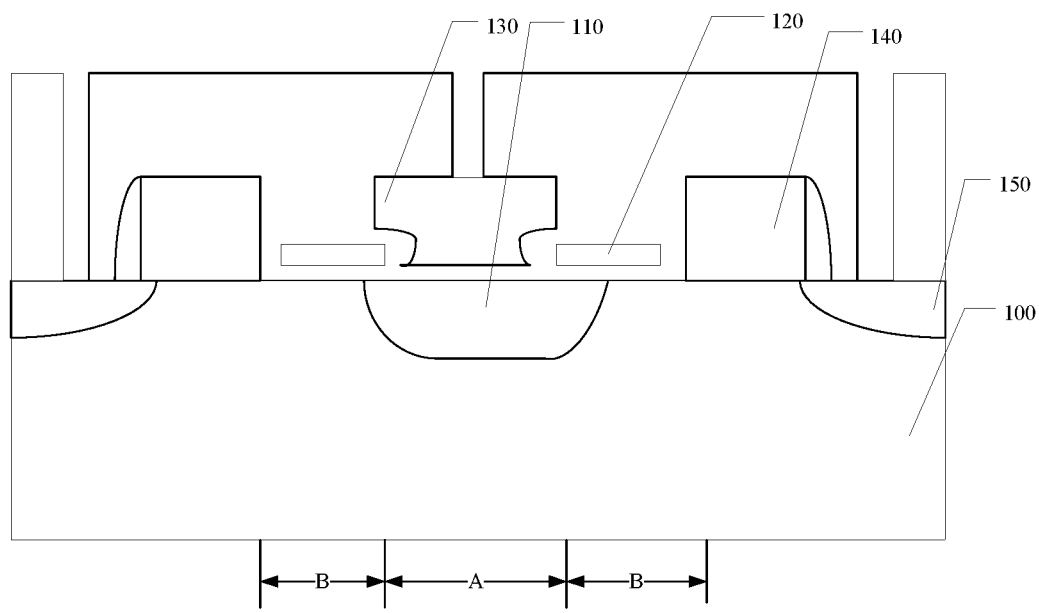
FIG. 1 schematically illustrates a sectional view of a flash memory.

As mentioned in the background, there is a need for improving flash memory performance.
FIG. 1 schematically illustrates a sectional view of a flash memory.
Referring to FIG. 1, the flash memory includes a semiconductor substrate 100. The semiconductor substrate 100 includes: an erasing region A and a floating gate region B, wherein the floating gate area B is adjacent to the erasing region A and each side of the erasing region A is disposed with the erasing region B. An erasing gate structure 130 is disposed on the erasing region A of the semiconductor substrate 100. Floating gate structures 120 are respectively disposed on floating gate regions B of the semiconductor substrate 100. A word line structure 140 is disposed at one side of each floating gate structure 120, wherein each floating gate structure 120 is disposed between the erasing gate structure 130 and the word line structure 140. A source 110 is disposed in the erasing region A of the semiconductor substrate 100, and a bit line structure 150 is disposed in the semiconductor substrate 100, wherein the bit line structure 150 is disposed between word line structures 140 of two adjacent flash memories.

A typical operation on a cell is as follows: in a programming process, a voltage on the source 110 of a selected cell is 6V~9V, a voltage on the word line structure 140 is 0.7V~1V, a constant current inputted on the bit line structure 150 is 2 µA~5 µA, and a voltage on the erasing gate structure 130 is 4V~6V; in an erasing process, voltages on the source 110 of the selected cell, on the word line structure 140, and on the bit line structure 150 are 0V, and a voltage on the erasing gate structure 130 is 11V~13V; in a reading process, a voltage on the source 110 of the selected cell is 0V, a voltage on the word line structure 140 is 1V~2.5V, a voltage on the bit line structure 150 is 0.5V~1V, and a voltage on the erasing gate structure 130 is 0V.

In order to increase a coupling voltage of the source 110 with the floating gate structure 120 when programming, one method is to increase a coupling area between the floating gate structure 120 and the source 110, so as to increase a coupling rate between the floating gate structure 120 and the source 110. In programming, a high coupling voltage is generated on the floating gate structure 120 due to the high coupling rate, and more hot electrons are attracted to the floating gate structure 120 so as to program the floating gate structure 120.

In the structure of the above flash memory, a floating gate channel area accounts for about a half of the size of the floating gate structure 120, while the floating gate structure 120 above the source 110 is used for voltage coupling. In order to make a higher a voltage applied on the floating gate structure 120 when programming, it is necessary to ensure that an overlapping area between the source 110 and the floating gate structure 120 has a larger size, which leads to a large size of the whole flash memory, and does not meet the trend of miniaturization of semiconductor devices.

Thus, embodiments of the present disclosure provide a method for forming a memory, including: providing a base with a first fin formed thereon, wherein the first fin includes an erasing region and a floating gate region, the floating gate region is adjacent to the erasing region and each side of the erasing region is disposed with the floating gate region, wherein the base is further disposed with a second fin on both sides of the first fin and the second fin elongates along a direction perpendicular to an elongation direction of the first fin, and a surface of the erasing region and a surface of the second fin are covered with a sacrificial layer; forming a floating gate structure across the floating gate region on the base, wherein a surface of the floating gate structure is lower than a top surface of the sacrificial layer; forming a first sidewall film on the base, wherein the first sidewall film covers a top surface and sidewall surfaces of the floating gate structure, and a top surface of the first sidewall film is flush with the top surface of the sacrificial layer; removing the sacrificial layer to form an opening in the floating gate structure and the first sidewall film so as to expose the surface of the erasing region and the surface of the second fin at a bottom of the opening; and forming an erasing gate structure in the opening, wherein a surface of the erasing gate structure is flush with the top surface of the first sidewall film. The memory formed by the method has good performance.

In order to make above purposes, features and effects of the present disclosure more obvious and understandable, specific embodiments of the present disclosure will be described in detail below in combination with the attached drawings.

FIGS. 2 to 19 schematically illustrates intermediate sectional structures of the method for forming a memory according to an embodiment of the present disclosure.

Figure 2:
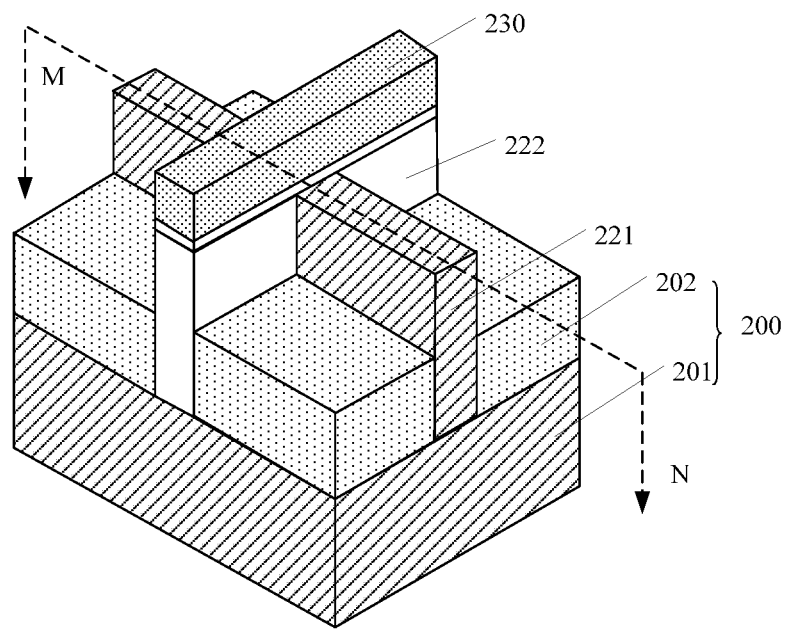
FIGS. 2 to 19 schematically illustrate intermediate sectional structures of a method for forming a memory according to an embodiment of the present disclosure.
Figure 3:
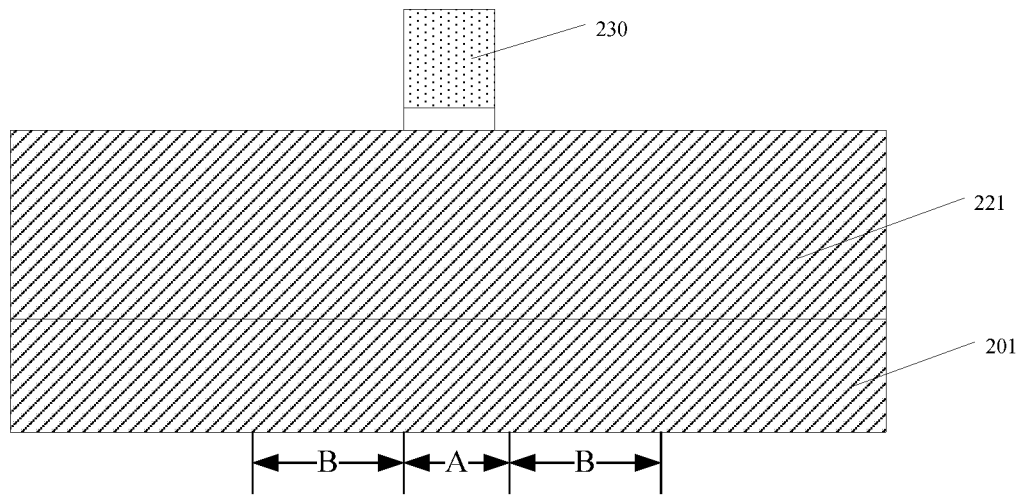

Referring to FIGS. 2 to 3. FIG. 3 is a sectional schematic view of FIG. 2 along a line M-N. A base 200 is provided. The base 200 is disposed with a first fin 221. The first fin 221 includes an erasing region A and a floating gate region B. The floating gate region B is adjacent to the erasing region A, and two sides of the erasing region A are disposed with the floating gate region B. The base 200 is also disposed with a second fin 222 on both sides of the first fin 221. The second fin 222 elongates along a direction perpendicular to an elongation direction of the first fin 221. A sacrificial layer 230 is disposed on a surface of the erasing region A and a surface of the second fin 222.

In some embodiment, the base 200 includes a substrate 201 and an isolation structure 202 on a surface of the substrate 201. The isolation structure 202 is disposed on sidewall surfaces of the first fin 221 and sidewall surfaces of the second fin 222, and a top surface of the isolation structure 202 is lower than a top surface of the first fin 221 and a top surface of the second fin 222.

The isolation structure 202 is used for electrical isolation between different devices.

The substrate 201 is made of a semiconductor material. In some embodiment, the substrate 201 is made of silicon. In other embodiments, the base may be made of a material selected from a group consisting of silicon carbide, silicon germanium, multi-component semiconductor materials composed of group III-V elements, silicon on insulator (SOI) and germanium on insulator. Among them, the multi-component semiconductor materials composed of group III-V elements may include InP, GaAs, GaP, InAs, InSb, InGaAs or InGaAsP.

In some embodiment, before forming the isolation structure 202, the method also includes: performing an ion implantation process on the first fin 221 and the second fin 222. A first well region (not shown in the figure) is formed in the first fin 221, and a second well region (not shown in the figure) is formed in the second fin 222.

In some embodiment, the first well region and the second well region have p-type conductivity, and ions doped in the first well region and the second well region are p-type ions, including boron ions, gallium ions or indium ions. In other embodiments, the first well region and the second well region have n-type conductivity, and ions doped in the first well region and the second well region are p-type ions, including phosphorus ions and arsenic ions.

The sacrificial layer 230 may be made of a material selected from a group consisting of silicon oxide, silicon nitride, silicon carbonitride, silicon boronnitride, silicon oxycarbonitride and silicon oxynitride.

In some embodiment, the sacrificial layer 230 is made of silicon nitride.

In some embodiment, a protective layer (not shown in the figure) is also disposed on the surface of the erasing region A of the first fin 221 and the surface of the second fin 222, and the protective layer is disposed among the sacrificial layer 230, the erasing region of the first fin 221 and the second fin 222. The protective layer is configured to protect the surface of the erasing region A and the second fin 222 from being damaged by subsequent etching processes.

Afterwards, a floating gate structure across the floating gate region is formed on the base, and a surface of the floating gate structure is lower than a top surface of the sacrificial layer. For the specific process of forming the floating gate structure, please refer to FIGS. 4 to 9.

Figure 4:
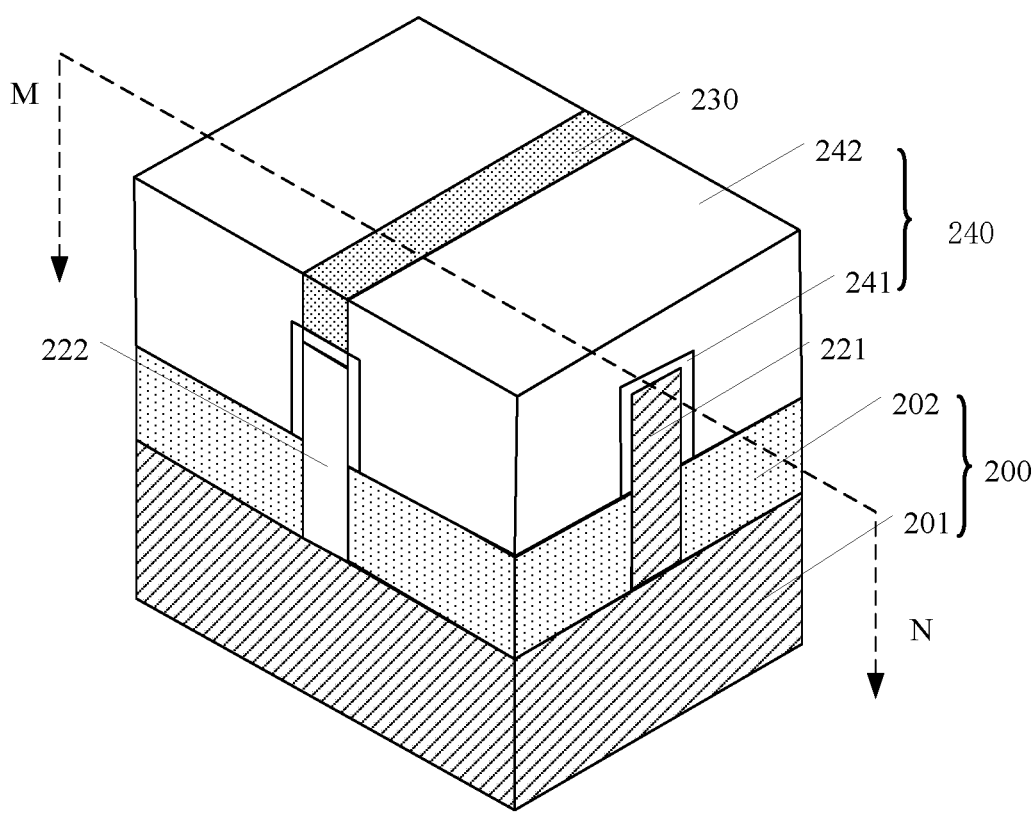
Figure 5:
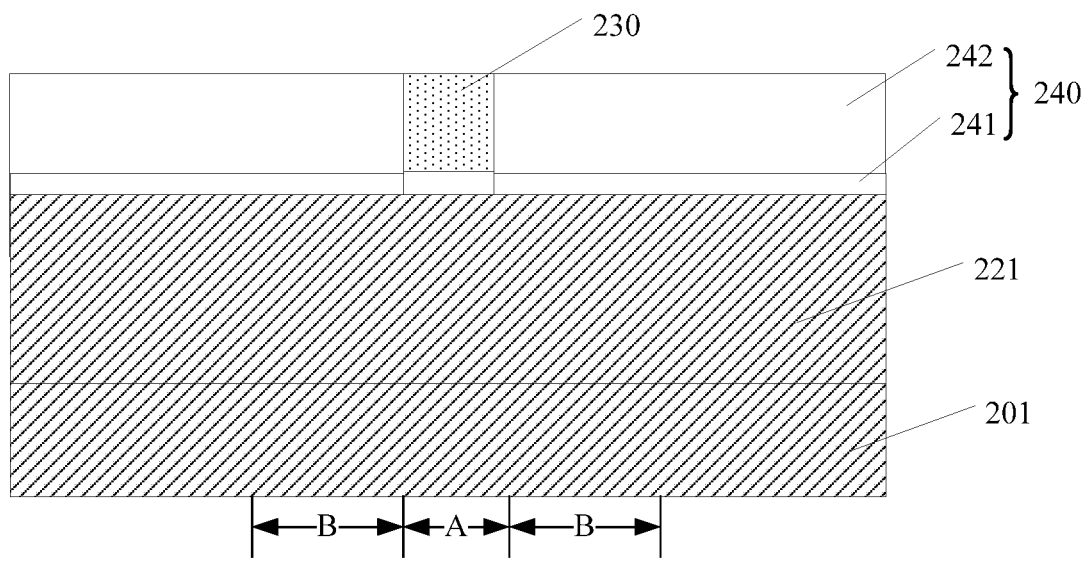

Referring to FIGS. 4 to 5, FIG. 4 is a schematic view based on FIG. 2, and FIG. 5 is a schematic view based on FIG. 3. An initial floating gate film (shown in the figure) is formed on the base 200, wherein the initial floating gate film covers the top surface and sidewall surfaces of the first fin 221, sidewall surfaces of the second fin 222, and the top surface and sidewall surfaces of the sacrificial layer 230. The initial floating gate film is planarized until the top surface of the sacrificial layer 230 is exposed. A floating gate film 240 is formed on the base 200, and a surface of the floating gate film 240 is flush with the top surface of the sacrificial layer 230.

The initial floating gate film provides a material layer for subsequent formation of the floating gate structure.

The floating gate film 240 includes a floating gate dielectric film 241 and a floating gate electrode film 242.

In some embodiment, the floating gate dielectric film 241 is an initial floating gate dielectric film.

The initial floating gate film includes: an initial floating gate dielectric film disposed on the top surface and sidewall surfaces of the first fin 221 and on the sidewall surfaces of the second fin 222, and an initial floating gate electrode film (not shown in the figure) disposed on a surface of the initial floating gate dielectric film and on the top surface and the sidewall surfaces of the sacrificial layer 230.

The initial floating gate dielectric film is made of silicon oxide or a high-K dielectric material, and the initial floating gate electrode film is made of polysilicon or a metal material.

In some embodiment, the initial floating gate dielectric film is made of silicon oxide, and the initial floating gate electrode film is made of polysilicon.

By forming the floating gate structure film 240 in the floating gate region B, the floating gate structure film 240 crosses the top surface and the sidewall surfaces of the floating gate region B of the first fin 221. Therefore, after subsequently etching of the floating gate structure film 240, the formed floating gate structure 260 crosses the top surface and the sidewall surfaces of the floating gate region B of the first fin 221, that is, the floating gate structure 260 surrounds the floating gate region B of the first fin 221. Thus, a coupling area between the floating gate structure 260 and the source subsequently formed in the second fin 222 and the erasing region A of the first fin 221 is increased, which thereby increases a coupling rate between the source and the floating gate structure 260, so that a coupling voltage of the source on the floating gate structure 260 increases during programming. Further, the subsequently formed erasing gate structure is disposed on the surfaces of the erasing region A and the second fin, the erasing gate structure has a planar structure, and a coupling area between the erasing gate structure and the floating gate is relative small. By making the coupling area between the erasing gate structure and the floating gate structure smaller than the coupling area between the source and the floating gate structure, the coupling rate between the erasing gate structure and the floating gate structure is decreased, which facilitates improving erasing and writing efficiency, and thus improves the performance of the formed memory.

Figure 6:
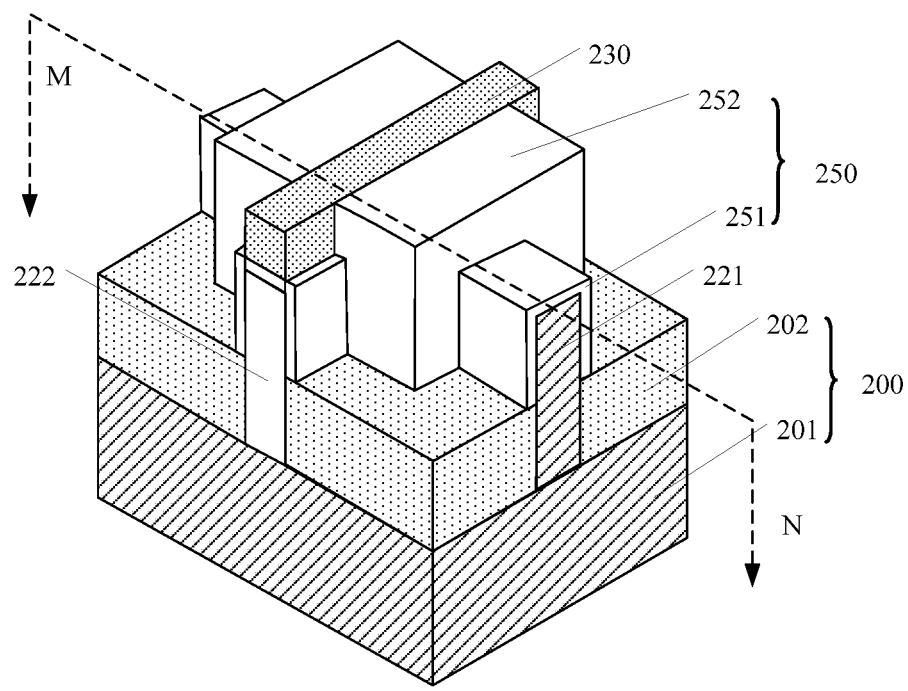
Figure 7:
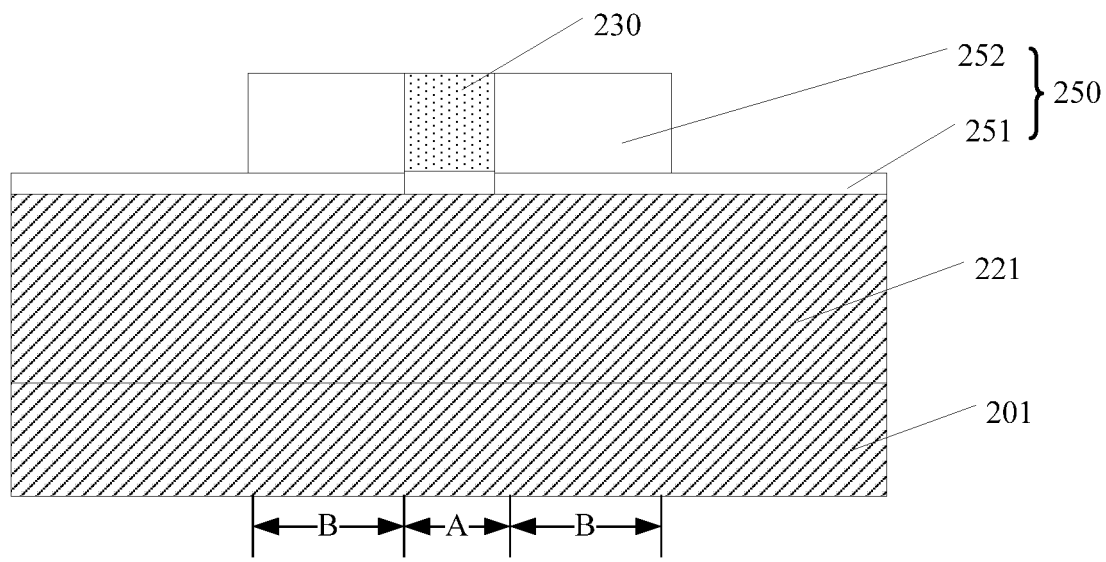

Referring to FIGS. 6 to 7, FIG. 6 is a schematic view based on FIG. 4, and FIG. 7 is a schematic view based on FIG. 5. A first patterning layer (not shown in the figure) is formed on the surface of the floating gate film 240, and the first patterning layer covers the surface of the floating gate film 240 on the floating gate region B and covers a portion of the surface of the gate film 240 at two sides of the floating gate region B along the direction perpendicular to the first fin 221. The floating gate film 240 is etched with the first patterning layer as a mask, until the surface of the base 200 is exposed, and an initial floating gate structure 250 across the floating gate region B is formed on the base 200.

In some embodiment, the floating gate film 240 is etched until the surface of the isolation structure 202 is exposed.

The initial floating gate structure 250 is used to subsequently form the floating gate structure.

The initial floating gate structure 250 includes an initial floating gate dielectric layer 251 and an initial floating gate electrode layer 252 disposed on a surface of the initial floating gate dielectric layer 251.

In some embodiment, the initial floating gate dielectric layer 251 is the floating gate dielectric film 241 in the floating gate film 240.

In some embodiment, the floating gate film 240 is etched to expose the initial floating gate dielectric layer 251 disposed on the top surface and sidewall surfaces of the first fin 221.

Figure 8:
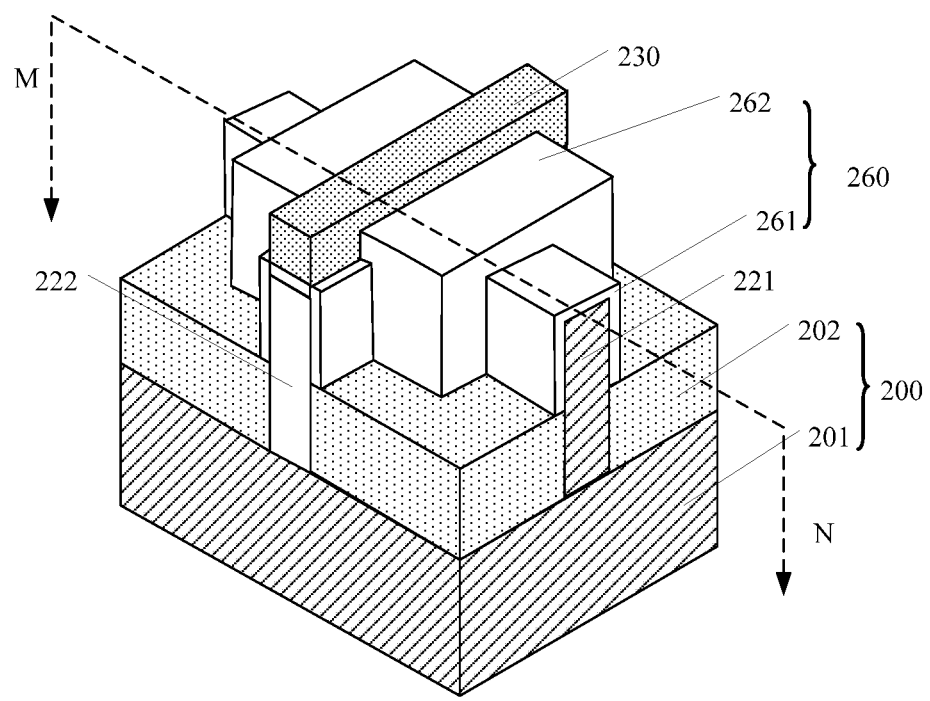
Figure 9:
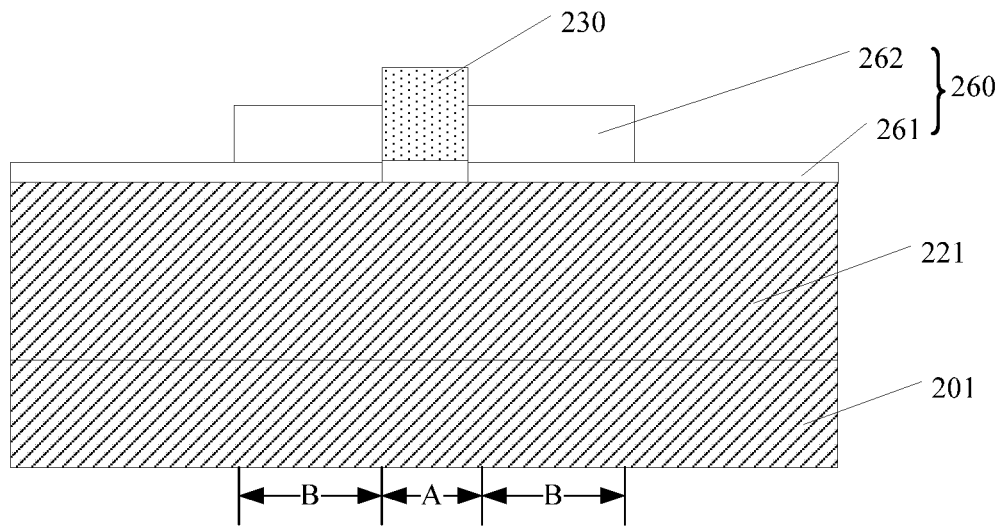

Referring FIGS. 8 to 9, FIG. 8 is a schematic diagram based on FIG. 6, and FIG. 9 is a schematic diagram based on FIG. 7. The initial floating gate structure 250 is etched back to form the floating gate structure 260, so that a top surface of the floating gate structure 260 is lower than the top surface of the sacrificial layer 230.

The floating gate structure 260 is used for storing electrons.

The floating gate structure 260 includes a floating gate dielectric layer 261 disposed on the top surface and sidewall surfaces of the floating gate region B of the first fin 221 and a floating gate electrode layer 262 disposed on a surface of the floating gate dielectric layer 261.

In some embodiment, the floating gate dielectric layer 261 is the initial floating gate dielectric layer 251 in the initial floating gate structure 250.

Then, a first sidewall film is formed on the top surface and the sidewall surfaces of the floating gate structure on the base, and a top surface of the first sidewall film is flush with the top surface of the sacrificial layer. Please refer to FIGS. 10 to 11 for the process of forming the first sidewall film.

Figure 10:
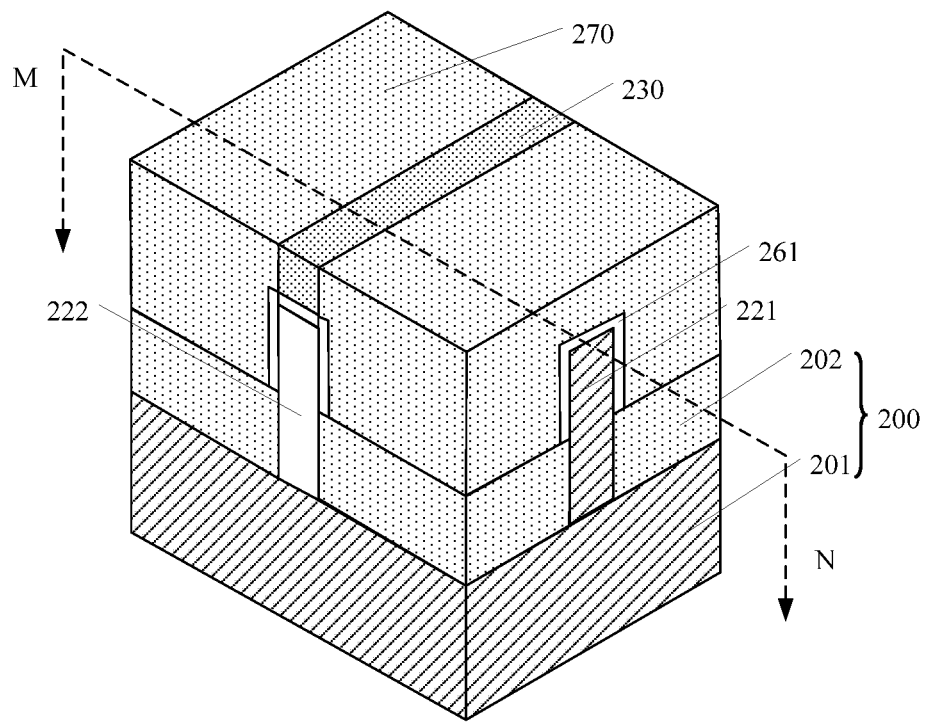
Figure 11:
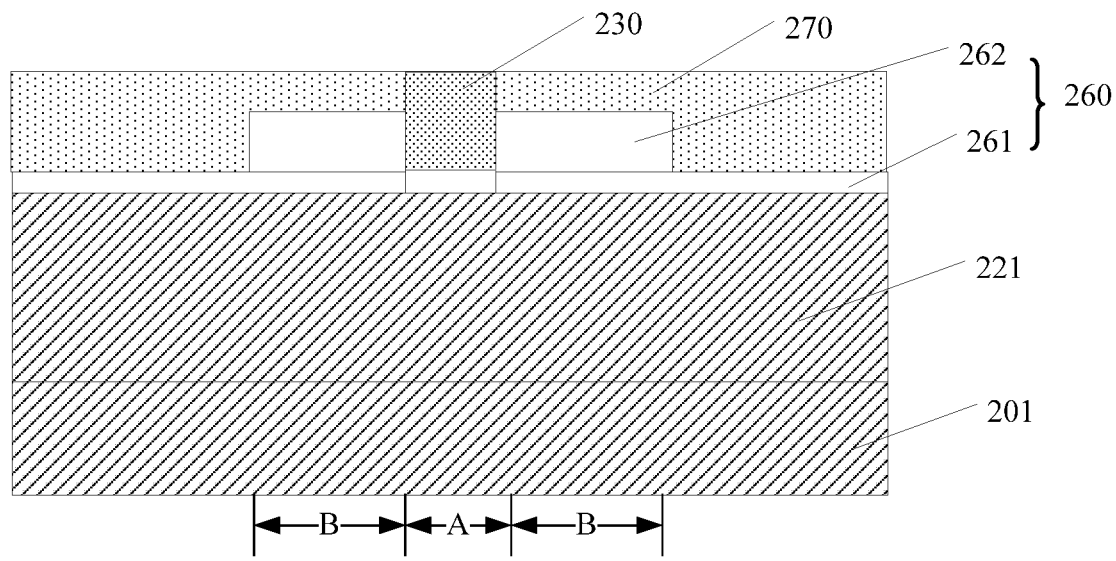

Referring to FIGS. 10 to 11, FIG. 10 is a schematic view based on FIG. 8, and FIG. 11 is a schematic view based on FIG. 9. A first sidewall film (not shown) covering the first fin 221 and the second fin 222 is formed on the base 200. The first sidewall film is disposed on the top surface and sidewall surfaces of the floating gate structure 260 and the surface of the sacrificial layer 230. The first sidewall film is planarized to expose the top surface of the sacrificial layer 230 so as to form a first sidewall film 270 covering the top surface and the sidewall surfaces of the floating gate structure 260 on the base 200.

The first sidewall film 270 is used to subsequently form the first sidewall.

The sacrificial layer 230 is made of a material different from that of the first sidewall film 270, which is helpful to avoid affecting the first sidewall film 270 in the subsequent etching process of removing the sacrificial layer 230.

The first sidewall film 270 is made of a material selected from a group consisting of silicon oxide, silicon nitride, silicon carbonitride, silicon boronnitride, silicon oxycarbonitride and silicon oxynitride.

In some embodiment, the first sidewall film 270 is made of silicon oxide.

The process of planarizing the first sidewall film includes a chemical mechanical polishing process.

Figure 12:
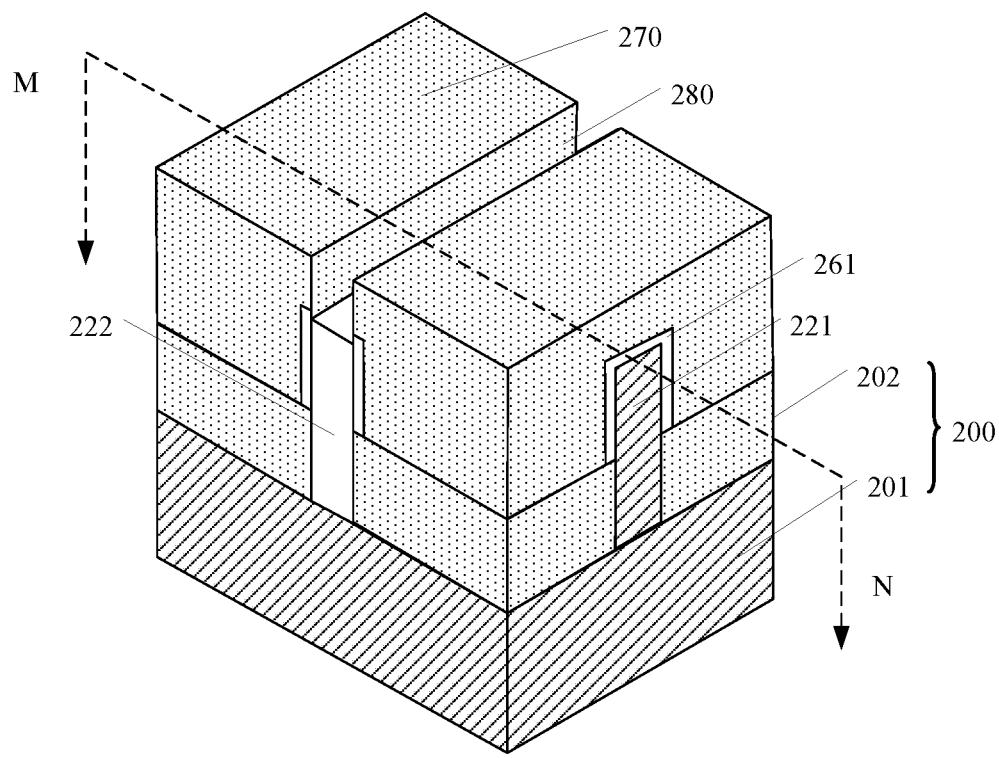
Figure 13:
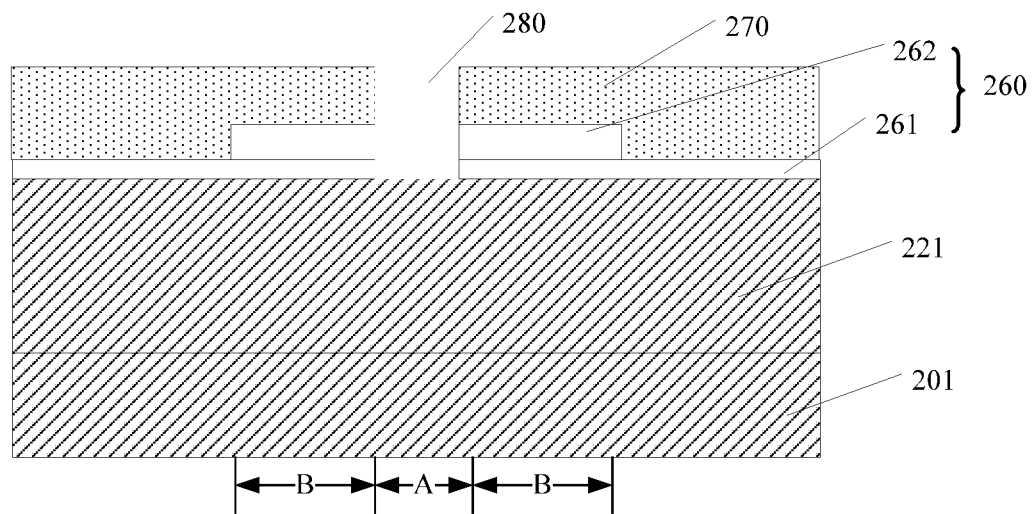

Referring to FIGS. 12 to 13, FIG. 12 is a schematic view based on FIG. 10, and FIG. 13 is a schematic view based on FIG. 11. After the first sidewall film 270 is formed, the sacrificial layer 230 is removed. An opening 280 is formed in the floating gate structure 260 and the first sidewall film 270, and the surface of the erasing region A and the surface of the second fin 222 are exposed at the bottom of the opening 280.

The process of removing the sacrificial layer 230 includes one or a combination of a dry etching process and a wet etching process.

In some embodiment, the process of removing the sacrificial layer 230 is a wet etching process.

Next, an erasing gate structure is formed in the opening, and a surface of the erasing gate structure is flush with the top surface of the first sidewall film. For a specific process of forming the erasing gate structure, please refer to FIGS. 14 to 15.

Figure 14:
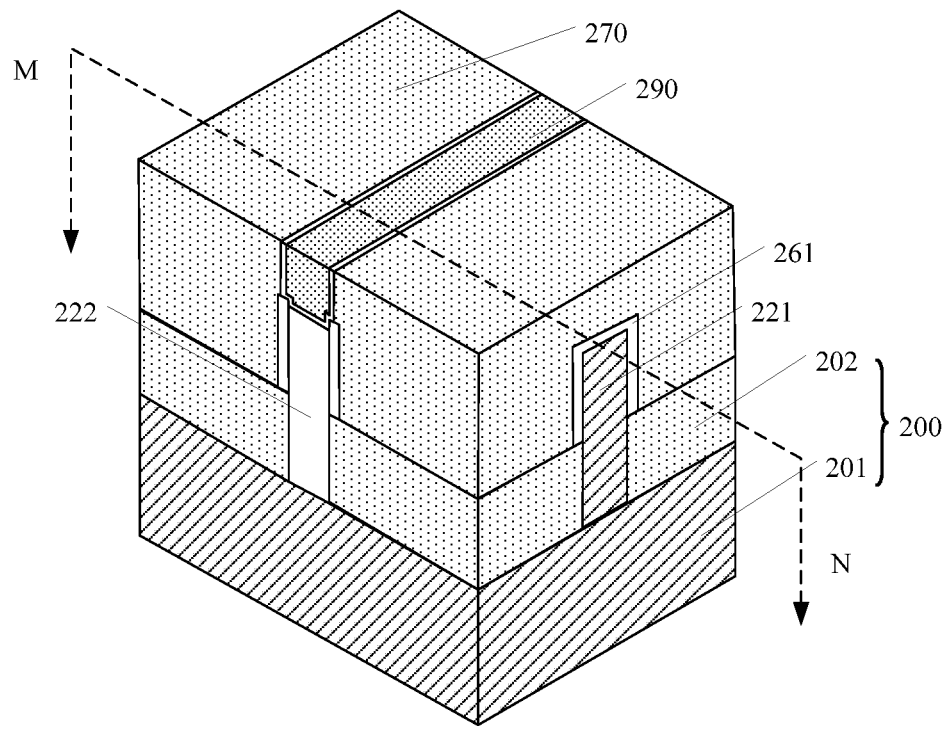
Figure 15:
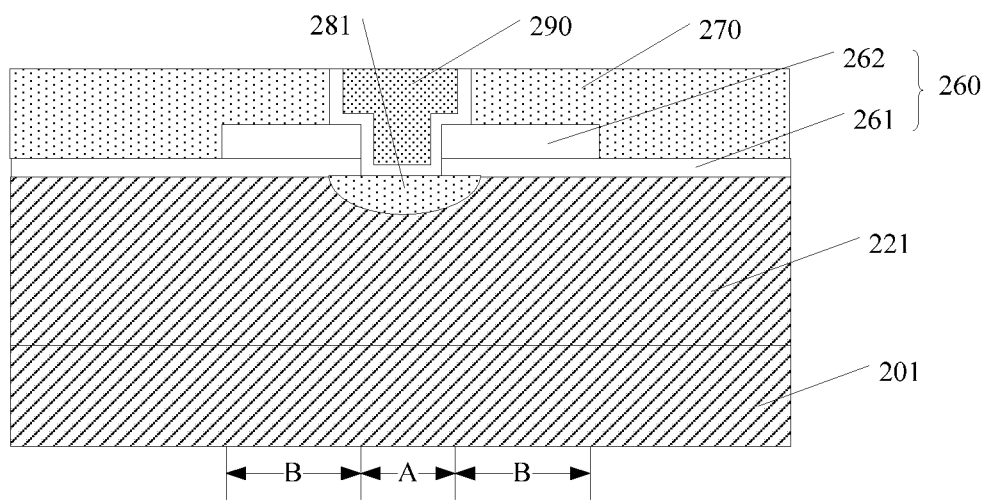

Referring to FIGS. 14 to 15, FIG. 14 is a schematic view based on FIG. 12, and FIG. 15 is a schematic view based on FIG. 13. An erasing gate film (not shown in the figure) is formed in the opening 280 and on the top surface of the first sidewall film 270. The erasing gate film is planarized to expose the top surface of the first sidewall film so as to form the erasing gate structure 290 on the erasing region A of the first fin 221 and the second fin 222.

In some embodiment, the erasing gate structure 290 includes an erasing gate dielectric layer (not shown in the figure) disposed on a sidewall surface and a bottom surface of the opening 280 and an erasing gate electrode layer (not shown in the figure) disposed on a surface of the erasing gate dielectric layer.

The erasing gate film includes an erasing dielectric film disposed on the sidewall surface and the bottom surface of the opening 280 and the top surface of the first sidewall film 270, and an erasing electrode film disposed on a surface of the erasing dielectric film. The erasing dielectric film is made of silicon oxide or a high-K dielectric material, and the erasing electrode film is made of polysilicon or a metal material.

In some embodiment, the material of the erasing dielectric film is silicon oxide, and the material of the erasing electrode film is polysilicon.

In some embodiment, forming the erasing gate structure 290 further includes: removing a portion of the first sidewall film 270 exposed from the sidewall of the opening 280 before forming the erasing gate film in the opening 280 and on the top surface of the first sidewall film 270, so that an overlapping area between the subsequently formed erasing gate structure 290 and the floating gate structure 260 has a sharp angle, which facilitates discharging of the floating gate structure 260, thereby improving the erasing efficiency.

In some embodiment, after the opening 280 is formed and before the erasing gate structure is subsequently formed, the method further includes: forming a source 281 in the erasing region B of the first fin 221 and the second fin 222 at the bottom of the opening 280.

The process of forming the source 281 includes: performing an ion implantation process on the erasing region A of the first fin 221 and the second fin 222 at the bottom of the opening 280 with the floating gate structure 260 and the first sidewall film 270 as a mask to form the source 281.

Figure 16:
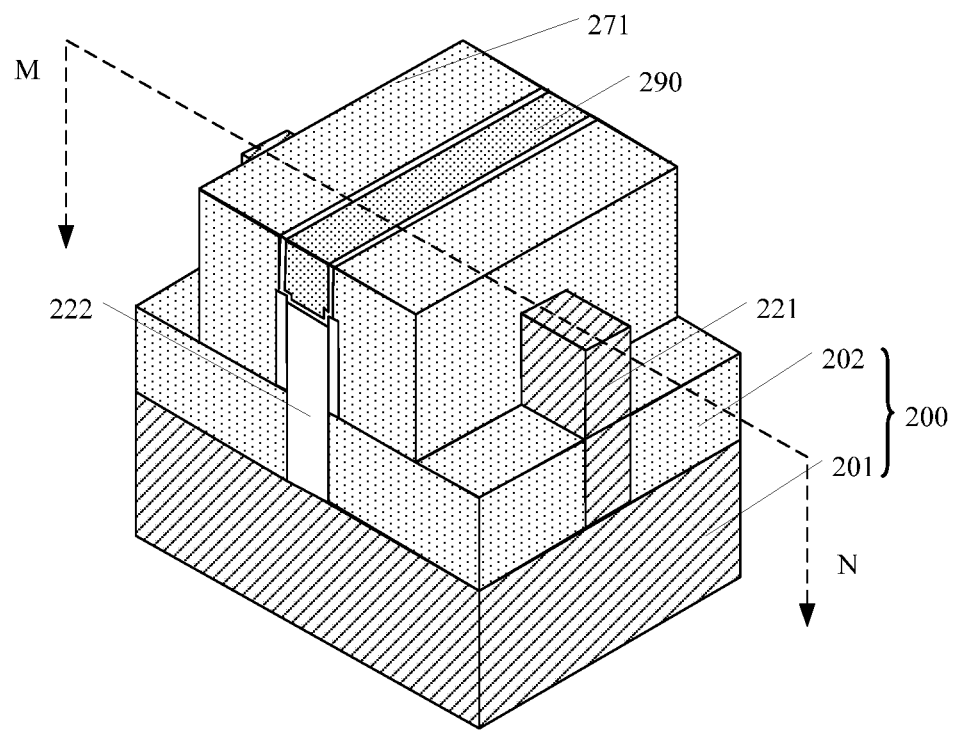
Figure 17:
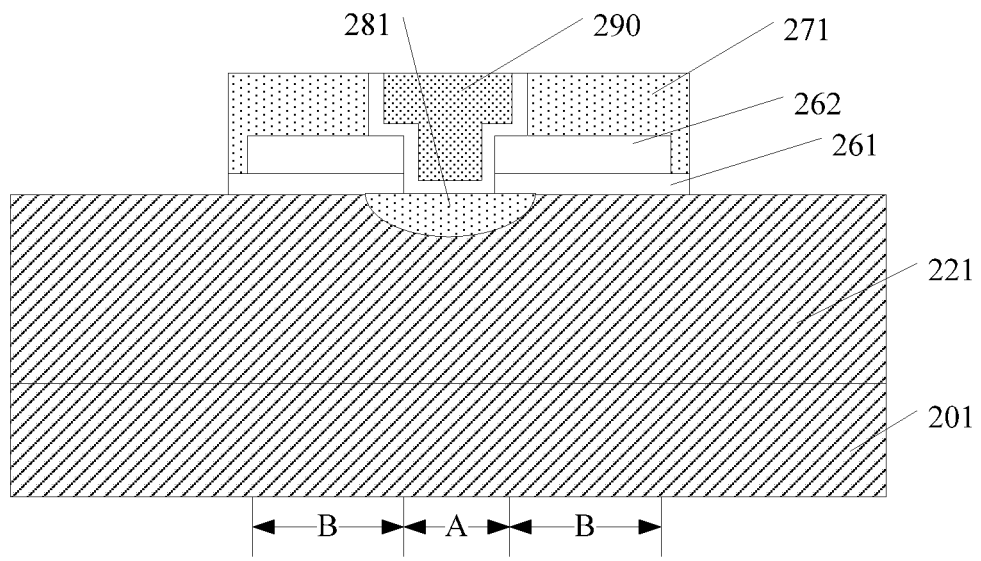

Referring to FIGS. 16 and 17, FIG. 16 is a schematic view based on FIG. 14, and FIG. 17 is a schematic diagram based on FIG. 15. A portion of the first sidewall film 270 is etched to expose the top surface of the first fin 221 and the surface of the base 200 so as to form a first sidewall 271, and the first sidewall 271 is disposed on the top surface and the sidewall surfaces of the floating gate structure 260.

The first sidewall 271 is configured to isolate the floating gate structure 260 and a subsequently formed word line structure.

Etching a portion of the first sidewall film 270 includes: forming a second patterning layer (not shown in the figure) on the surface of the first sidewall film 270, wherein the second patterning layer is disposed on the surface of the first sidewall film 270 on the floating gate region B, and on the surface of the first sidewall film 270 on two sides of the floating gate region B along the direction perpendicular to the elongation direction of the first fin; and etching the first sidewall film 270 with the second patterning layer as a mask to expose the surface of the base 200 so as to form the first sidewall film 271.

In some embodiment, during etching a portion of the first sidewall film 270, the floating gate dielectric layer 261 on the top surface and the sidewall surfaces of a portion of the first fin 221 is also etched to expose the top surface and sidewall surfaces of a portion of the first fin 221.

Figure 18:
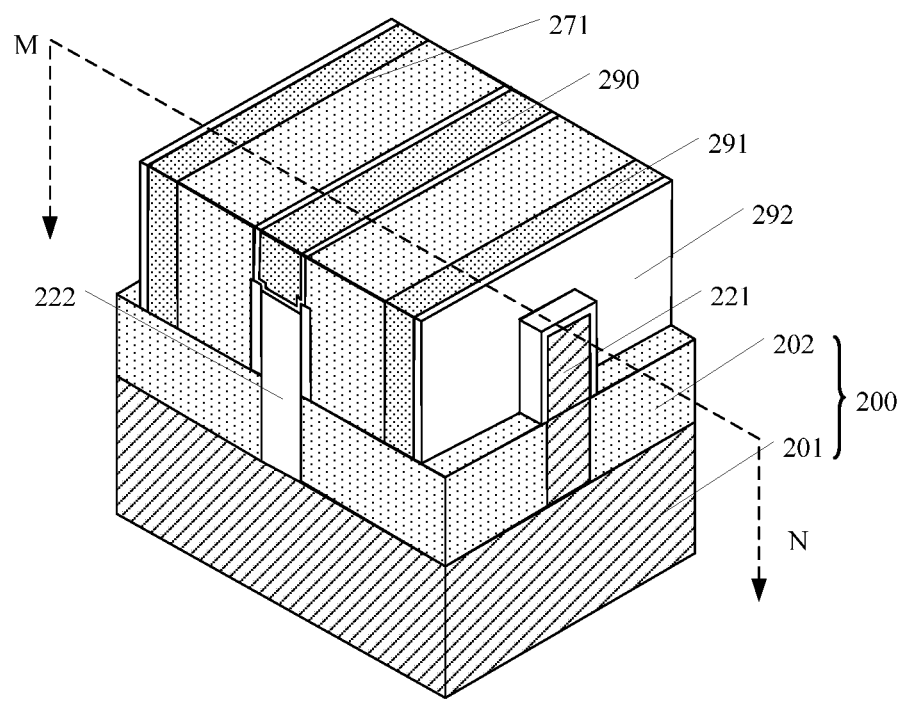
Figure 19:
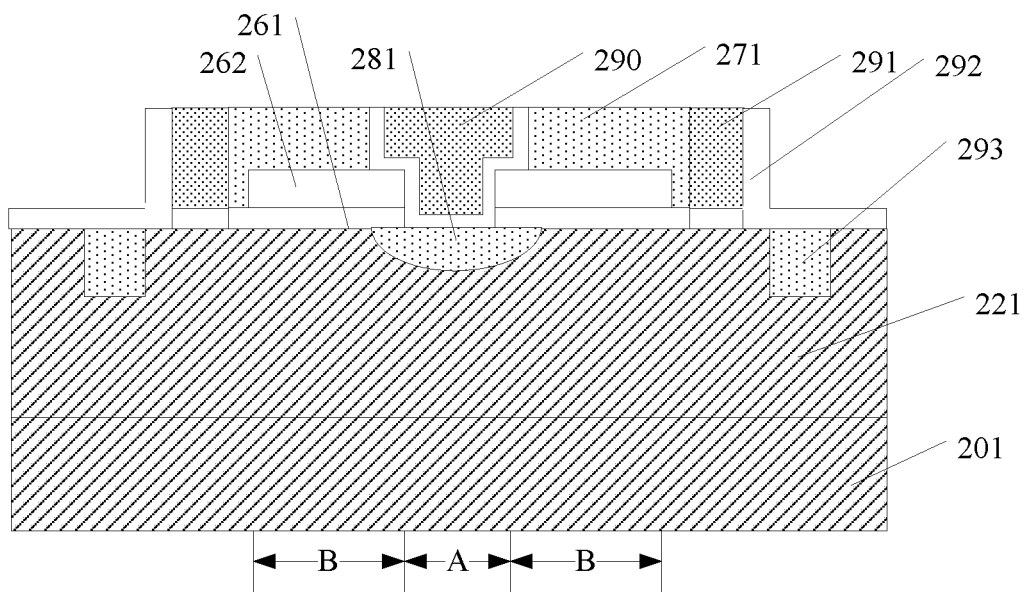

Referring to FIGS. 18 and 19, FIG. 18 is a schematic view based on FIG. 16, and FIG. 19 is a schematic view based on FIG. 17. After the first sidewall 271 is formed, forming a word line structure 291 on the sidewall surface of the first sidewall 271 along the elongation direction of the first fin 221, wherein the word line structure 291 is disposed on the sidewall surfaces and the top surface of the first fin 221; forming a second sidewall 292 on a sidewall surface of the word line structure 291 along the elongation direction of the first fin 221; and forming a bit line structure 293 in the first fin 221 on two sides of the first sidewall 271, the erasing gate structure 290, the second sidewall 292 and the word line structure 291.

The word line structure 291 is used for a selection tube of a floating gate unit.

The process of forming the word line structure 291 includes: forming an initial word line film (not shown in the figure) on the base 200 covering the top surface and sidewall surfaces of the first fin 221, the surface of the erasing gate structure 290 and the top surface and sidewall surface of the first sidewall 271; planarizing the initial word line film to expose the surface of the erasing gate structure 290 so as to form a word line film (not shown in the figure) on the base 200, wherein the word line film is disposed on the sidewall surface of the first sidewall 271 along the elongation direction of the first fin 221; forming a third patterning layer (not shown in the figure) on a surface of the word line film, wherein the third patterning layer is disposed on the surfaces of the erasing gate structure 290, the first sidewall 271 and a portion of the word line film; and etching the word line film with the third patterning layer as a mask to expose the surface of the base 200 so as to form the word line structure 291.

The initial word line film includes: an initial word line dielectric film (not shown in the figure) disposed on the top surface and sidewall surfaces of the first fin 221 and on the surface of the erasing gate structure 290, and an initial word line electrode film (not shown in the figure) disposed on a surface of the initial word line dielectric film and on the top surface and the sidewall surface of the first sidewall 271.

The initial word line dielectric film is made of silicon oxide or a high K dielectric material, and the initial word line electrode film is made of polysilicon or a metal material.

The second sidewall 292 is used to protect the sidewall surface of the word line structure 291 to prevent the subsequent metallization process of silicon from affecting the word line structure 291.

In some embodiment, forming the bit line structure 293 includes: etching the first fin 221 to form a groove (not shown in the figure) in the first fin 221 with the first sidewall 271, the erasing gate structure 290, the second sidewall 292 and the word line structure 291 as a mask; and forming an epitaxy layer (not shown in the figure) in the groove in an epitaxy process to form the bit line structure 293.

In some embodiment, forming the bit line structure 293 further includes: implementing an in-situ doping process to dope ions in the epitaxial layer to form the bit line structure 293.

In other embodiments, forming the bit line structure includes: performing an ion implantation process on the first fin to form the bit line structure in the first fin with the first sidewall, the erasing gate structure, the second sidewall and the word line structure as a mask.

The floating gate structure 260 and the word line structure 291 are used together to control a reading status of the memory. The floating gate structure 260 crosses the top surface and the sidewall surfaces of the floating gate region B of the first fin 221, that is, the floating gate structure 260 surrounds the floating gate region B of the first fin 221, which facilitates increasing an effective width of a channel at the bottom of the floating gate structure 260. Therefore, a channel resistance between the source 281 and the bit line structure 293 is reduced, which facilitates increasing a reading current, so that the performance of the formed memory is better.

Further, an embodiment of the present disclosure further provides a memory formed by using the foregoing method. Still referring to FIG. 14, the memory includes: a base 200 with a first fin 221 formed thereon, wherein the first fin 221 includes an erasing region A and a floating gate region B, and the floating gate region B is adjacent to the erasing region A and each side of the erasing region A is disposed with the floating gate region B, wherein the base 200 is further disposed with a second fin 222 on both sides of the first fin 221, and the second fin 222 elongates along a direction perpendicular to the elongation direction of the first fin 221; a first sidewall 271 disposed on a top surface and sidewall surfaces of the floating gate structure on the base 200, wherein a top surface of the first sidewall 271 is flush with the top surface of the sacrificial layer 230; and an erasing gate structure 290 disposed on the erasing region A of the first fin 221 and the second fin 222, wherein a surface of the erasing gate structure 290 is flush with the surface of the first sidewall 271.

The memory further includes a source 281 disposed in the erasing region A of the first fin 221 and the second fin 222.

The memory further includes: a word line structure 291 disposed on a sidewall surface of the first sidewall 271 along the elongation direction of the first fin 221, wherein the word line structure 291 runs across the first fin 221; and a second sidewall 292 disposed on a sidewall surface of the word line structure along the elongation direction of the first fin 221, wherein the second sidewall 292 runs across the first fin 221; and a bit line structure 293 disposed in the first fin 221 on two sides of the first sidewall 271, the erasing gate structure 290, the second sidewall 292 and the word line structure 291.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. A method for forming a memory, comprising:
providing a base with a first fin formed thereon, wherein the first fin comprises an erasing region and a floating gate region, the floating gate region is adjacent to the erasing region and each side of the erasing region is disposed with the floating gate region, wherein the base is further disposed with a second fin on both sides of the first fin and the second fin elongates along a direction perpendicular to an elongation direction of the first fin, and a surface of the erasing region and a surface of the second fin are covered with a sacrificial layer;
forming a floating gate structure across the floating gate region on the base, wherein a surface of the floating gate structure is lower than a top surface of the sacrificial layer;
forming a first sidewall film on the base, wherein the first sidewall film covers a top surface and sidewall surfaces of the floating gate structure, and a top surface of the first sidewall film is flush with the top surface of the sacrificial layer;
removing the sacrificial layer to form an opening in the floating gate structure and the first sidewall film so as to expose the surface of the erasing region and the surface of the second fin at a bottom of the opening; and forming an erasing gate structure in the opening, wherein a surface of the erasing gate structure is flush with the top surface of the first sidewall film.

2. The method according to claim 1, wherein forming the floating gate structure comprises:
   forming an initial floating gate film on the base covering a top surface and sidewall surfaces of the first fin, sidewall surfaces of the second fin and sidewall surfaces and the top surface of the sacrificial layer;
   planarizing the initial floating gate film to expose the top surface of the sacrificial layer to form a floating gate film on the base, wherein a surface of the floating gate film is flush with the top surface of the sacrificial layer;
   forming a first patterning layer on the surface of the floating gate film, wherein the first patterning layer covers the surface of the floating gate film on the floating gate region and covers a portion of the surface of the floating gate film at two sides of the floating gate region along the direction perpendicular to the elongation direction of the first fin;
   etching the floating gate film with the first patterning layer as a mask to expose a surface of the base so as to form an initial floating gate structure across the floating gate region on the base; and
   etching back the initial floating gate structure to form the floating gate structure so that the top surface of the floating gate structure is lower than the top surface of the sacrificial layer.

3. The method according to claim 2, wherein the initial floating gate film comprises:
   an initial floating gate dielectric film disposed on the top surface and the sidewall surfaces of the first fin and on the sidewall surfaces of the second fin; and
   an initial floating gate electrode film disposed on a surface of the initial floating gate dielectric film and on the top surface and the sidewall surfaces of the sacrificial layer;
   wherein the initial floating gate dielectric film is made of silicon oxide or a high-k dielectric material, and the initial floating gate electrode film is made of polysilicon or a metal.

4. The method according to claim 1, wherein forming the first sidewall film comprises:
   forming the first sidewall film on the base covering the first fin and the second fin, wherein the first sidewall film is disposed on the top surface and the sidewall surfaces of the floating gate structure and a surface of the sacrificial layer; and
   planarizing the first sidewall film to expose the top surface of the sacrificial layer so to form the first sidewall film disposed on the top surface and the sidewall surfaces of the floating gate structure on the base.

5. The method according to claim 1, wherein the sacrificial layer is made of a material different from the first sidewall film, the sacrificial layer is made of a material selected from a group consisting of silicon oxide, silicon nitride, silicon carbonitride, silicon boronnitride, silicon oxycarbonitride and silicon oxynitride, and the first sidewall film is made of a material selected from a group consisting of silicon oxide, silicon nitride, silicon carbonitride, silicon boronnitride, silicon oxycarbonitride and silicon oxynitride.

6. The method according to claim 1, further comprising:
   forming a source in the erasing region of the first fin and in the second fin at the bottom of the opening after forming the opening and before forming the erasing region;
   wherein forming the source comprises: performing an ion implantation process on the erasing region of the first fin and the second fin at the bottom of the opening with the floating gate structure and the first sidewall film as a mask to form the source.

7. The method according to claim 1, wherein forming the erasing gate structure comprises:
   forming an erasing gate film in the opening and on the top surface of the first sidewall film; and
   planarizing the erasing gate film to expose the top surface of the first sidewall film so as to form the erasing gate structure on the erasing region of the first fin and the second fin.

8. The method according to claim 7, wherein the erasing gate film comprises:
   an erasing dielectric film disposed on a sidewall surface and a bottom surface of the opening and the top surface of the first sidewall film; and
   an erasing electrode film disposed on a surface of the erasing dielectric film;
   wherein the erasing dielectric film is made of silicon oxide or a high-k dielectric material, and the erasing electrode film is made of polysilicon or a metal.

9. The method according to claim 1, wherein after forming the erasing gate structure, the method further comprises:
   etching a portion of the first sidewall film to expose a surface of the base so as to form a first sidewall, wherein the first sidewall is disposed on the top surface and the sidewall surfaces of the floating gate structure;
   forming a word line structure on a sidewall surface of the first sidewall along the elongation direction of the first fin after forming the first sidewall, wherein the word line structure is disposed on sidewall surfaces and a top surface of the first fin;
   forming a second sidewall on a sidewall surface of the word line structure along the elongation direction of the first fin; and
   forming a bit line structure in the first fin on two sides of the first sidewall, the erasing gate structure, the second sidewall and the word line structure.

10. The method according to claim 9, wherein forming the word line structure comprises:
    forming an initial word line film on the base covering the top surface and the sidewall surfaces of the first fin, the surface of the erasing gate structure and a top surface and the sidewall surface of the first sidewall;
    planarizing the initial word line film to expose the surface of the erasing gate structure so as to form a word line film on the base, wherein the word line film is disposed on the sidewall surface of the first sidewall along the elongation direction of the first fin;
    forming a third patterning layer on a surface of the word line film, wherein the third patterning layer is disposed on the erasing gate structure, the first sidewall and a portion of the surface of the word line film; and
    etching the word line film with the third patterning layer as a mask to expose the surface of the base so as to form the word line structure.

11. The method according to claim 10, wherein the initial word line film comprises:
    an initial word line dielectric film disposed on the top surface and sidewall surfaces of the first fin and on the surface of the erasing gate structure, and
    an initial word line electrode film disposed on a surface of the initial word line dielectric film and on the sidewall surface and the top surface of the first sidewall;

wherein the initial word line dielectric film is made of silicon oxide or a high K dielectric material, and the initial word line electrode film is made of polysilicon or metal.

12. The method according to claim 9, wherein etching a portion of the first sidewall film comprises:
    forming a second patterning layer on the surface of the first sidewall film, wherein the second patterning layer is disposed on the surface of the first sidewall film on the floating gate region and on the surface of the first sidewall film on two sides of the floating gate region along the direction perpendicular to the elongation direction of the first fin; and
    etching the first sidewall film with the second patterning layer as a mask to expose the surface of the base so as to form the first sidewall.

13. The method according to claim 9, wherein forming the bit line structure comprises:
    performing an ion implantation process on the first fin to form the bit line structure in the first fin with the first sidewall, the erasing gate structure, the second sidewall and the word line structure as a mask.

14. The method according to claim 9, wherein forming the bit line structure comprises:
    etching the first fin to form a groove in the first fin with the first sidewall, the erasing gate structure, the second sidewall and the word line structure as a mask; and
    forming an epitaxy layer in the groove in an epitaxy process to form the bit line structure.

15. A memory, comprising:
    a base with a first fin formed thereon, wherein the first fin comprises an erasing region and a floating gate region, the floating gate region is adjacent to the erasing region and each side of the erasing region is disposed with the floating gate region, wherein the base is further disposed with a second fin on both sides of the first fin and the second fin elongates along a direction perpendicular to an elongation direction of the first fin;
    a floating gate structure across the floating gate region of the first fin on the base, wherein a surface of the floating gate structure is lower than a top surface of a sacrificial layer;
    a first sidewall disposed on a top surface and sidewall surfaces of the floating gate structure, wherein a top surface of the first sidewall is flush with the top surface of the sacrificial layer; and
    an erasing gate structure disposed on the erasing region of the first fin and the second fin, wherein a surface of the erasing gate structure is flush with the surface of the first sidewall.

16. The memory according to claim 15, further comprising: a source disposed in the erasing region of the first fin and disposed in the second fin.

17. The memory according to claim 15, further comprising:
    a word line structure disposed on a sidewall surface of the first sidewall along the elongation direction of the first fin, wherein the word line structure runs across the first fin;
    a second sidewall disposed on a sidewall surface of the word line structure along the elongation direction of the first fin, wherein the second sidewall runs across the first fin; and
    a bit line structure disposed in the first fin on two sides of the first sidewall, the erasing gate structure, the second sidewall and the word line structure.

* * * * *